(12) United States Patent
Huo et al.

(10) Patent No.: US 9,714,876 B2
(45) Date of Patent: Jul. 25, 2017

(54) SEMICONDUCTOR STRAIN GAUGE

(71) Applicant: Sensata Technologies, Inc., Attleboro, MA (US)

(72) Inventors: Shihong Huo, Bedford, MA (US); Cory Bousquet, Cranston, RI (US); Daniel Goncalves, Milford, MA (US)

(73) Assignee: Sensata Technologies, Inc., Attleboro, MA (US)

( * ) Notice: Subject to any disclaimer, the term of this patent is extended or adjusted under 35 U.S.C. 154(b) by 98 days.

(21) Appl. No.: 14/669,297

(22) Filed: Mar. 26, 2015

(65) Prior Publication Data
US 2016/0282205 A1 Sep. 29, 2016

(51) Int. Cl.
*G01L 9/00* (2006.01)
*G01L 1/18* (2006.01)
*G01R 17/00* (2006.01)
*G01L 19/00* (2006.01)

(52) U.S. Cl.
CPC ............. *G01L 1/18* (2013.01); *G01L 9/0042* (2013.01); *G01L 9/0054* (2013.01); *G01L 19/0084* (2013.01); *G01R 17/00* (2013.01)

(58) Field of Classification Search
None
See application file for complete search history.

(56) References Cited

U.S. PATENT DOCUMENTS

| | | | |
|---|---|---|---|
| 4,287,772 A | 9/1981 | Mounteer et al. | |
| 5,866,822 A * | 2/1999 | Willig | B60T 7/042 73/719 |
| 6,700,174 B1 * | 3/2004 | Miu | G01L 9/0051 257/419 |
| 2007/0202628 A1 | 8/2007 | Wuertz | |
| 2015/0377729 A1 * | 12/2015 | Hio | G01L 9/0051 73/726 |
| 2016/0025581 A1 * | 1/2016 | Kazama | G01L 9/0054 73/721 |
| 2016/0133762 A1 * | 5/2016 | Blasco Claret | H01L 27/14685 257/432 |

FOREIGN PATENT DOCUMENTS

| | | | |
|---|---|---|---|
| EP | 2620757 A1 | | 7/2013 |
| JP | 406037334 | * | 2/1994 |

OTHER PUBLICATIONS

Partial European Search Report for EP16161772, "Semiconductor Strain Gauge", date of mailing Aug. 24, 2016.

* cited by examiner

Primary Examiner — Robert R Raevis
(74) Attorney, Agent, or Firm — Burns & Levinson LLP; George N. Chaclas; Daniel McGrath

(57) ABSTRACT

Methods and apparatus for a semiconductor strain gauge pressure sensor. An apparatus includes a sense element configured to be exposed to a pressure environment, the sense element including at least one highly doped semiconductor strain gauge, the highly doped semiconductor strain gauge including a five pad single full Wheatstone bridge, an electronics package disposed on a carrier and electrically coupled to the sense element, the carrier disposed on a port that comprises the sense element, a housing disposed about the sense element and electronics package, and a connector joined to the housing and electrically connected to the electronics package, the connector including an external interface.

13 Claims, 6 Drawing Sheets

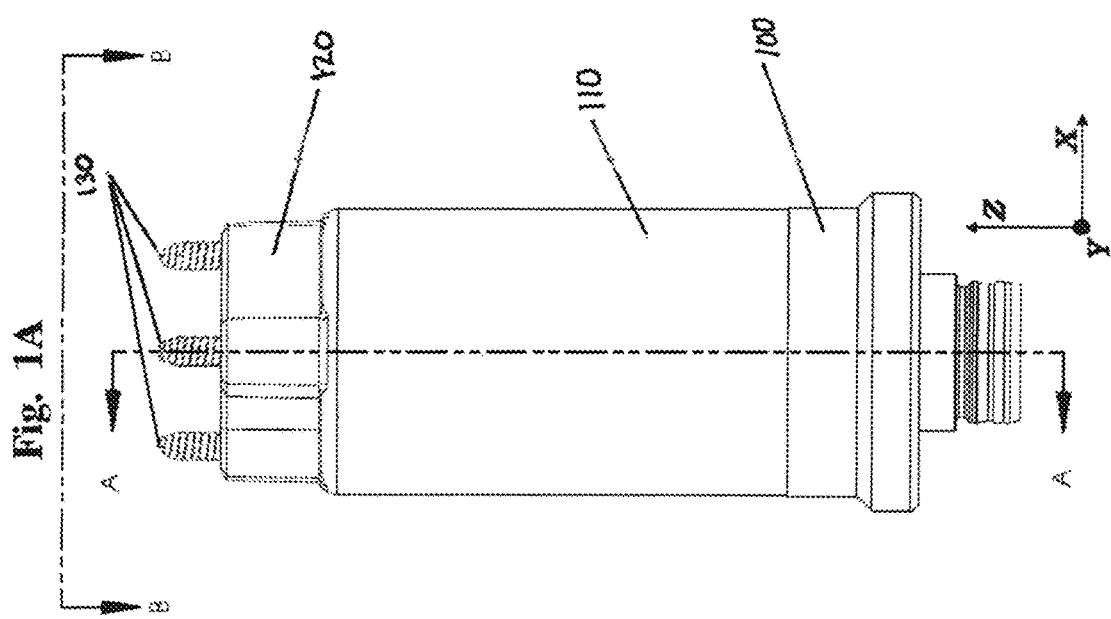

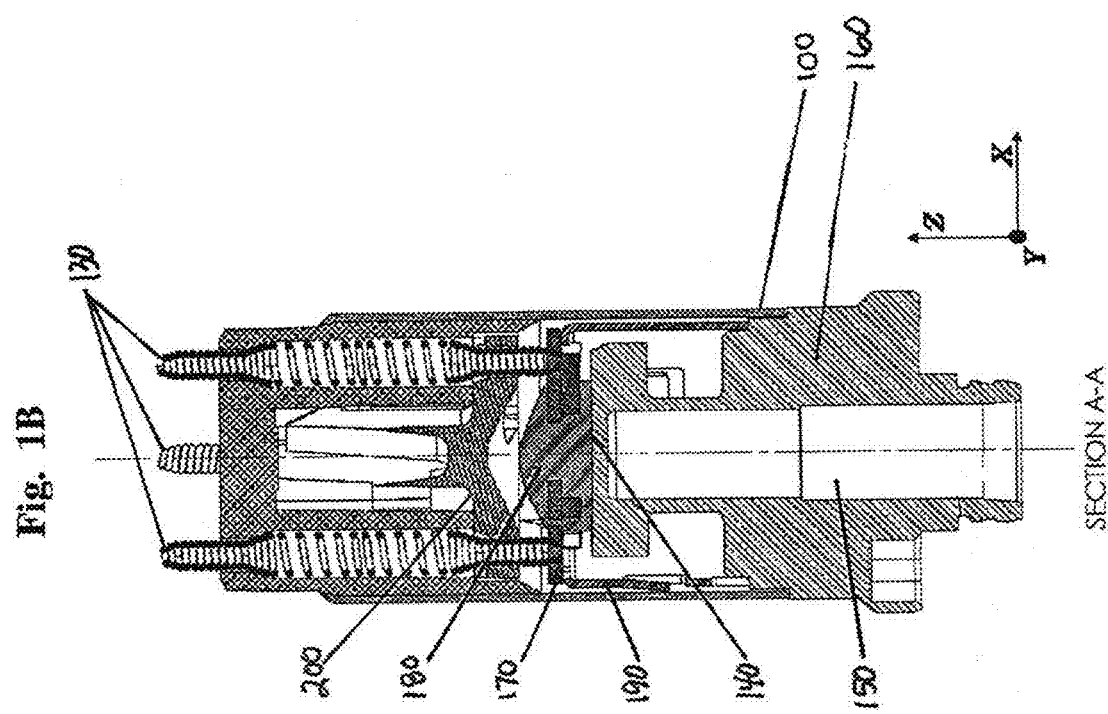

SECTION B-B

SEMICONDUCTOR STRAIN GAUGE

BACKGROUND OF THE INVENTION

The invention relates generally to sensors, and more specifically to a semiconductor strain gauge.

In general, microfused silicon strain gauge (MSG) pressure sensors are widely used throughout the automotive industry for applications ranging from brake, transmission and fuel pressure sensors, to occupant weight force sensing. Such pressure sensors typically include silicon strain gauge elements which are glass-bonded to a stainless steel diaphragm. The design of the sensor is such that it provides a linear voltage output which is directly proportional to the applied pressure on the steel diaphragm by calibration.

SUMMARY OF THE INVENTION

The following presents a simplified summary of the innovation in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides methods and apparatus for a semiconductor strain gauge.

In an aspect, the invention features an apparatus including a sense element configured to be exposed to a pressure environment, the sense element including at least one highly doped semiconductor strain gauge, the highly doped semiconductor strain gauge including a five pad single full Wheatstone bridge, an electronics package disposed on a carrier and electrically coupled to the sense element, the carrier disposed on a port that comprises the sense element, a housing disposed about the sense element and electronics package, and a connector joined to the housing and electrically connected to the electronics package, the connector including an external interface.

In another aspect, the invention features a highly doped semiconductor strain gauge including a five pad single full Wheatstone bridge, four piezoresistive resistors, and an insulation layer on a sidewall.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The invention will be more fully understood by reference to the detailed description, in conjunction with the following figures, wherein:

FIG. 1A, FIG. 1B and FIG. 1C are illustrations of an exemplary microfused silicon strain gauge (MSG) pressure sensor.

DETAILED DESCRIPTION

Figure 1C:
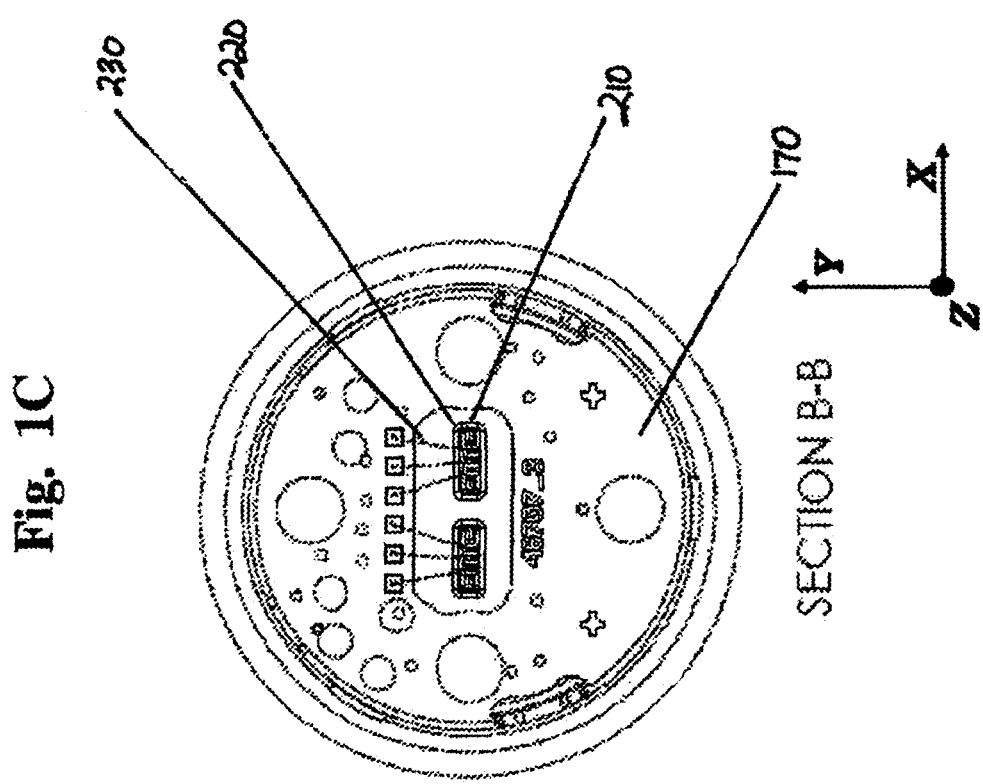

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

In the description below, the term "or" is intended to mean an inclusive "or" rather than an exclusive "or." That is, unless specified otherwise, or clear from context, "X employs A or B" is intended to mean any of the natural inclusive permutations. That is, if X employs A, X employs B, or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

As shown in FIG. 1, an exemplary pressure sensor 100 is shown contained within a housing 110. The housing 110 includes a spring guide 120, which may include a number of springs 130. The springs 130 may protrude from the top of the spring guide 120. FIG. 1B is a cutaway view of the pressure sensor 100 depicted in FIG. 1A, wherein the cutaway view is along Axis A.

As shown in FIG. 1B, pressure sensor 100 is disposed about a longitudinal axis. A sensing element diaphragm 140 is exposed to an external environment (i.e., a pressurized environment) through an inner borehole 150 that is open to the environment. The inner borehole 150 is centrally disposed about axis A-A and provided within a pressure port body 160. Mounted onto the pressure port body 160, and generally perpendicular to the longitudinal axis, is a printed circuit board (PCB) 170, which is disposed along axis as shown in FIG. 1A. Generally, the PCB 170 is disposed onto the pressure port body 160 with a suitable gel 180 therebetween. A support ring 190 is circumferentially disposed about the PCB 170 and serves to maintain centering of the PCB 170, while the springs 130 cooperate with a spring retainer 200.

As shown in FIG. 1C, the PCB 170 is host to a glass substrate 210 onto which at least one strain gauge 220 is mounted. Each strain gauge 220 is electrically coupled to the PCB 170 by bonded wires 230.

Figure 2:
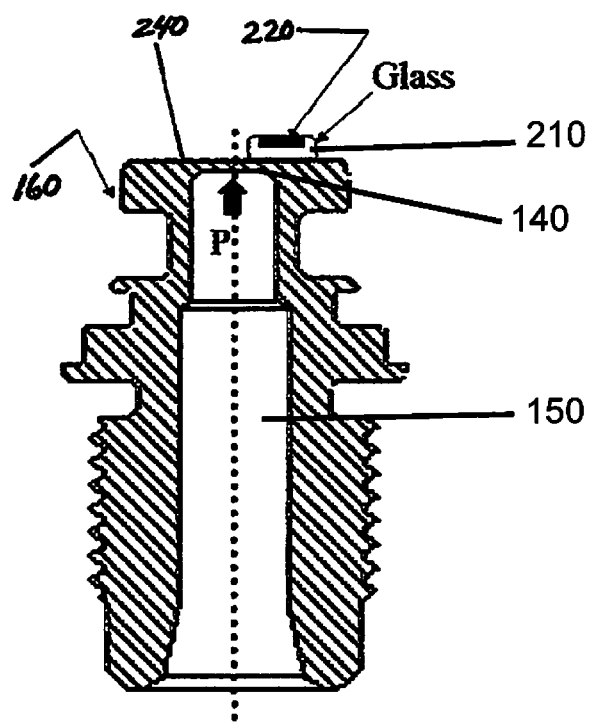
FIG. 2 is an illustration of an exemplary highly doped semiconductor single full Wheatstone strain gauge in accordance with the present invention.

As shown in FIG. 2, the exemplary highly doped semiconductor single full Wheatstone strain gauge 220 in accordance with the present invention is glass bonded on a top surface 240 of the steel port body 160, wherein "P" refers to a direction of pressure applied to the steel port body 160.

Figure 3:
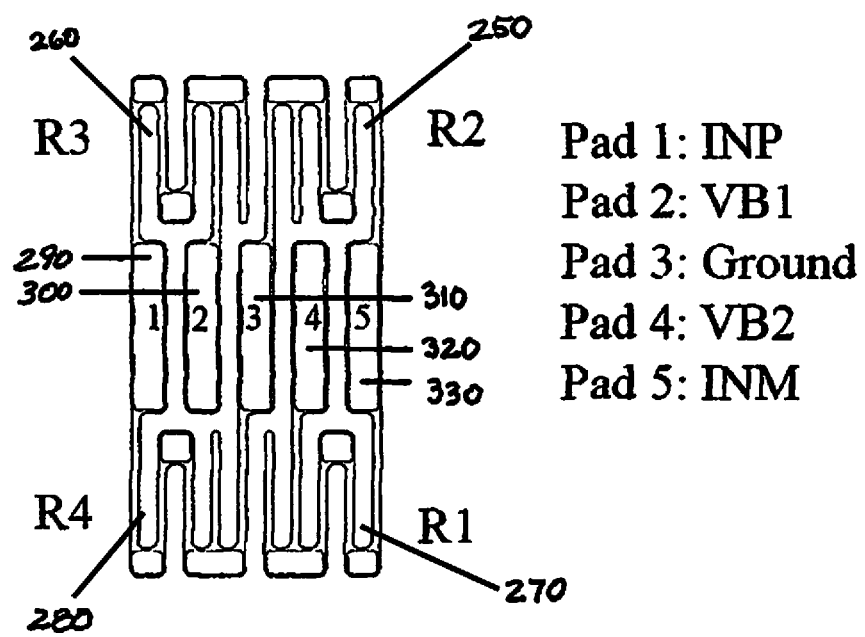
FIG. 3 illustrates a top view of the semiconductor single full Wheatstone strain gauge of the present invention.

As shown in FIG. 3, a top view of the semiconductor single full Wheatstone strain gauge 220 includes four piezoresistive resisters 250 (R2), 260 (R3), 270 (R1), 280 (R4). In addition, in one embodiment, the strain gauge 220 includes five pads 290, 300, 310, 320, 330. In one embodiment, pads 290, 330 are bridge outputs, pad 310 is a ground, and pads 300, 320 are voltage supplies. This five pad silicon gauge configuration enables the ground pad 310 to be in the middle and connecting a resister in tension (250) and a resister in compression (280) as pressure is applied to the steel port body 160, simultaneously a resistor (2601 is in tension and a resistor (2701 is in compression, hence a Wheatstone bridge is formed to sense a pressure change.

This five pad silicon gauge configuration also provides a cost reduction compared to using two half bridges. Moreover, this five pad silicon gauge configuration reduces a pressure nonlinearity due to two pairs of resisters being symmetric. In addition, this five pad silicon gauge configuration, where there are five identical oriented parallel pads eases a wire bonding process.

Figure 4:
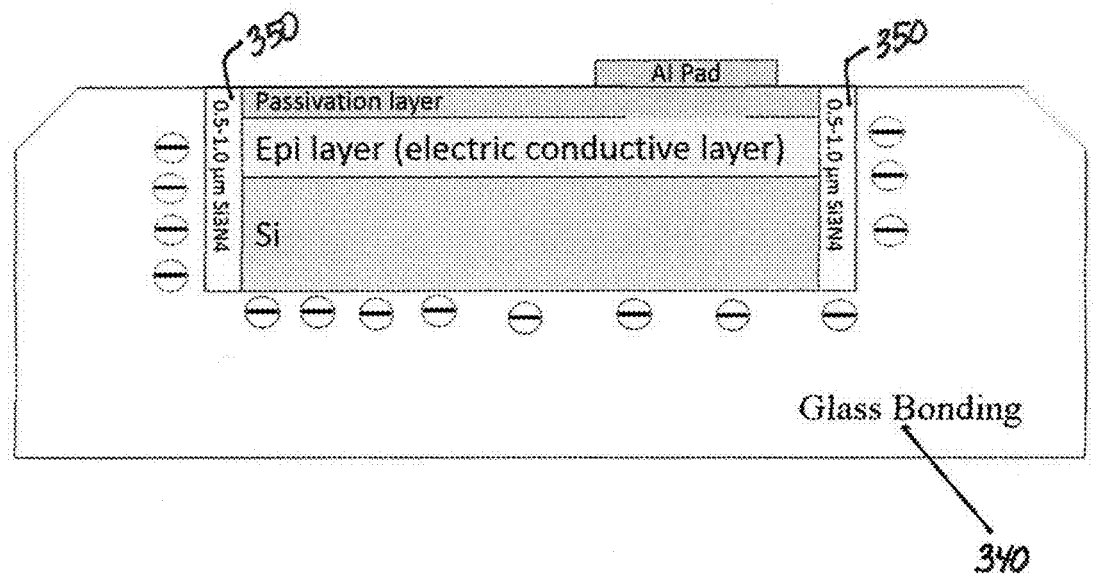
FIG. 4 illustrates a cross section view of a highly doped semiconductor strain gauge that includes an insulation layer.

As shown in FIG. 4, the highly doped semiconductor strain gauge 220, as described above, is usually bonded to the steel pressure port body 160 by glass 340. The glass insulation resistance and chemical network bonding is good for a certain temperature range. When environmental temperature increased to a threshold level and if the sensor is continuously powered, there are significant ionic migration and accumulation in glass, since an epitaxial (EPI) layer is directly in contact with glass; this may change the semiconductor silicon gauge resistance and resulting sensor output drift. The highly doped semiconductor strain gauge 220 includes an insulation layer 350 on the gauge's sidewall, to barrier the gauge and block mobile ion migration. As a result, inclusion of the insulation layer 350 significantly reduces a sensor signal drift. In embodiments, the insulation layer 350 may be silicon mononitride (SiN) or silicon nitride ($Si_3/N_4$).

In other embodiments, the highly doped semiconductor strain gauge 220 may be configured as a three pad half bridge, four pad full bridge, six pad full bridge, and so forth. Each of these embodiments may include a sidewall nitride deposition/insulation layer.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

What is claimed is:

1. An apparatus comprising:
   a sense element configured to sense pressure in a pressure environment, the sense element including at least one highly doped semiconductor strain gauge, the highly doped semiconductor strain gauge comprising a five pad single full Wheatstone bridge; and
   a printed circuit board disposed on a substrate and electrically coupled to the sense element, the substrate bonding the sense element on a port body,
   wherein the five pad single full Wheatstone bridge includes:
   a centrally positioned ground pad between a first voltage supply pad and a second voltage supply pad;
   a peripherally positioned first bridge output pad, the first voltage supply pad separating the first bridge output pad from the ground pad; and
   a peripherally positioned second bridge output pad, the second voltage supply pad separating the second bridge output pad from the ground pad.

2. The apparatus of claim 1 wherein the highly doped semiconductor strain gauge further comprises an insulation layer on a sidewall for at least partially isolating the Wheatstone bridge from the substrate.

3. The apparatus of claim 2 wherein the insulation layer comprises silicon mononitride (SiN).

4. The apparatus of claim 2 wherein the insulation layer comprises silicon nitride ($Si_3N_4$).

5. The apparatus of claim 1 wherein the five pad single full Wheatstone bridge further comprises four piezoresistive resisters.

6. The apparatus of claim 1 wherein the first bridge output pad, the first voltage supply pad, the ground pad, the second voltage supply pad and the second bridge output pad are aligned in a same orientation and parallel arrayed.

7. An apparatus for sensing a pressure of an environment comprising:
   a port body having a diaphragm and defining an inner borehole, the inner borehole configured to expose the diaphragm to the environment;
   a five pad single full Wheatstone bridge disposed on top of the port body and having a longitudinal and transverse axis, the five pad single full Wheatstone bridge having the following aligned in a parallel row along the longitudinal axis: a first bridge output pad; a first voltage supply pad; a ground pad, the transverse axis running through the center of the ground pad; a second voltage supply pad; and a second bridge output pad;
   a plurality of piezoresistive elements oriented within the five pad single Wheatstone bridge; and
   a printed circuit board disposed on a substrate and electrically coupled to the five pad single full Wheatstone bridge,
   wherein the longitudinal and transverse axis intersect to form a first quadrant, a second quadrant, a third quadrant, and a fourth quadrant.

8. The apparatus of claim 7 wherein: the first and fourth quadrants are disposed above the port body such that pressure from the pressure environment causes the first and fourth quadrants to be in compression; and the second and third quadrants are disposed above the diaphragm such that pressure from the pressure environment causes the second and third quadrants to be in tension.

9. The apparatus of claim 8 wherein the plurality of piezoresistive elements includes: a first resistor oriented in the first quadrant; a second resistor in the second quadrant; a third resistor in the third quadrant; and a fourth resistor in the fourth quadrant.

10. The apparatus of claim 9 wherein the substrate is glass.

11. The apparatus of claim 7 wherein the five pad single full Wheatstone bridge has a plurality of sidewalls, the sidewalls being separated from the substrate by an insulation layer for at least partially isolating the Wheatstone bridge from the substrate.

12. The highly doped semiconductor strain gauge of claim 11 wherein the insulation layer comprises silicon mononitride (SiN).

13. The highly doped semiconductor strain gauge of claim 11 wherein the insulation layer comprises silicon nitride ($Si_3N_4$).

* * * * *